(12) United States Patent
Suzuki

(10) Patent No.: US 7,233,152 B2
(45) Date of Patent: Jun. 19, 2007

(54) SHORT DETECTION CIRCUIT AND SHORT DETECTION METHOD

(75) Inventor: Yuzo Suzuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/144,013

(22) Filed: Jun. 3, 2005

(65) Prior Publication Data
US 2005/0270035 A1    Dec. 8, 2005

(30) Foreign Application Priority Data
Jun. 3, 2004    (JP)    .............. 2004-165540

(51) Int. Cl.
G01R 31/02    (2006.01)
G01R 31/26    (2006.01)

(52) U.S. Cl. .................. 324/523; 324/522; 324/527; 324/765; 324/158.1; 438/14

(58) Field of Classification Search ................ 324/523, 324/527
See application file for complete search history.

(56) References Cited

U.S. PATENT DOCUMENTS 5,877,631 A * 3/1999 Takahashi .................. 324/533
6,107,926 A * 8/2000 Kifuku et al. .............. 340/650
6,693,446 B2 * 2/2004 Song et al. ................. 324/719
2002/0089345 A1 * 7/2002 Doong et al. ............... 324/765

FOREIGN PATENT DOCUMENTS

| JP | H06-29364 A | 2/1994 |
| JP | H11-23668 A | 1/1999 |
| JP | 2004-14694 A | 1/2004 |

* cited by examiner

Primary Examiner—Andrew H. Hirshfeld
Assistant Examiner—John Zhu
(74) Attorney, Agent, or Firm—Sughrue Mion, PLLC

(57) ABSTRACT

A circuit and method for judging a latent short-circuit defect, also known as a short-circuit defect with time passing, in the case of a high voltage system. A detection-dedicated wiring for detecting a short-circuit defect is provided between a first high voltage system wiring and a second high voltage wiring. A power supply and an ammeter is connected in series and one end of it is connected to the high voltage system wiring and the other end of it is connected to the detection-dedicated wiring. If a current value us higher than a predetermined value when the power supply is turned on, one can judge that the circuit has a high possibility of the latent short-circuit defect.

14 Claims, 15 Drawing Sheets

HIGH VOLTAGE WIRING A

002

003

HIGH VOLTAGE WIRING B

SHORT DETECTION CIRCUIT AND SHORT DETECTION METHOD

BACKGROUND OF THE INVENTION

1. Field of the Invention

The present invention relates to a technique for detecting a short-circuit between interconnections of a semiconductor device.

2. Description of the Related Art

In the interconnections of the circuit in a semiconductor device and the like, a short-circuit is generated due to the contact of a conductive foreign matter with an interconnection and the other interconnection. This leads to the defect of a circuit. Even if the circuit is not judged as defective before shipping, there is a possibility that the circuit become defective depending on various conditions.

FIG. 1 is the plane view of a suspected substance. In FIG. 1, a conductive foreign matter 101 exists between a high-voltage interconnection A and a high-voltage interconnection B. The electric potential of the interconnection A and that of the interconnection B may be set in different. In this case, the high-voltage interconnection A and the high-voltage interconnection B are short-circuited through the conductive foreign matter Therefore, the suspected substance can be judged as being defective in a usual test.

On the other hand, referring to FIG. 2, the conductive foreign matter 102 is placed slightly apart from the high-voltage interconnection A. Therefore, the high-voltage interconnection A and the high-voltage interconnection B are not short-circuited. Therefore, the suspected substance should not be judged as being defective in a usual test. However, a stress and the like after the test may cause the conductive foreign matter 102 to contact the high-voltage interconnection A, and the high-voltage interconnection A and the high-voltage interconnection B will be possibly short-circuited. Such a phenomenon is hereafter referred to as a "short-defect with time passing" or a "latent short-circuit defect."

A method of applying overvoltage between interconnections has been used in a low-voltage circuit to detect the short-defect with time passing. On the other hand, in the case of a high-voltage circuit, it is necessary to apply higher voltage than the one used in a usual test for detecting the short-defect with time passing by applying overvoltage as well as the low-voltage circuit, and that possibly causes elements to be broken down or deteriorated.

Japanese Laid Open Patent Application (JP-A 2004-14694) as a conventional technique discloses an interconnection test pattern characterized in including at least two resistors the resistance values of which is known on a silicon substrate; an interconnection that connects the resistors electrically in series; an adjacent interconnection formed by the same material as the mentioned interconnection, which is placed adjacent to the interconnection with a predetermined interval; and two terminals that are electrically connected to the mentioned resistors respectively.

Japanese Laid Open Patent Application (JP-A H06-29364) discloses a semiconductor device characterized in including a group of interconnection layers mutually arranged in parallel and a test means that tests whether the mentioned group of interconnection layers is normal or not, wherein the mentioned test means includes; a first potential applying means to apply a first potential to a n-th interconnection layer (n is a multiple of two including 0) in the group of interconnection layers; and a second potential applying means to apply a second potential having at least a different potential from the first potential to n+1-th interconnection layer in the group of interconnection layers, in which, the first potential is applied to the n-th interconnection layer and the second potential is applied to the n+1 interconnection layer at the same time and this status is maintained during a predetermined time.

Japanese Laid Open Patent Application (JP-A H11-23668) discloses an interconnection defect testing circuit as a testing device, which is configured corresponding to an evaluation object circuit and provided on a same substrate as the evaluation object circuit, consisting of a first interconnection and a second interconnection which are electrically insulated, in which a detection circuit forming area for the same evaluation object circuit is divided into a plural, and an insulation-defective detection can be possible in each divided area.

SUMMARY OF THE INVENTION

In the high-voltage circuit, to detect a foreign matter between the interconnections by applying an electrical stress between the interconnections, it is necessary to supply a larger potential difference than the potential difference when the circuit is normally used. However, this testing method cannot be used in the high-voltage circuit since the element has a small margin of stress-resistance. Therefore, the suspected substance having the possibility of the short-defect with time passing due to the conductive foreign matter between interconnections cannot be judged as a defective. That causes a distribution of defective products.

Therefore, an object of the present invention is to provide the short detection circuit and the short detection method that make it possible to recognize the high-voltage circuit with high possibility of the short-defect with time passing.

Another object of the present invention is to provide the short detection circuit and the short detection method that can detect the circuit having high possibility of the short-defect with time passing in the high-voltage circuit without applying an excessive load to the elements.

According to the present invention, it is possible to provide the short detection circuit and the short detection method that make it possible to recognize the high-voltage circuit with high possibility of the short-defect with time passing.

In addition, according to the present invention, it is possible to provide the short detection circuit and the short detection method that can detect the circuit having high possibility of the short-defect with time passing in the high-voltage circuit without applying an excessive load to the element.

In an aspect of the present invention, a short detection circuit includes a first interconnection, a second interconnection and a first detecting interconnection positioned between the first interconnection and the second interconnection and unconnected to the first interconnection and the second interconnection. The first interconnection has a terminal for connecting to a power supply and an ammeter connected in series. The first interconnection has a terminal for connecting a power supply and an ammeter connected in series, and the second interconnection has a terminal for connecting a power supply and an ammeter connected in series.

In another aspect of the present invention, a method for detecting short-circuit includes a step of providing a first detecting interconnection between a first interconnection and a second interconnection, a first measuring step applying a predetermined value of voltage between the first interconnection and the first detecting interconnection and measuring a current, and a step of judging a possibility of short-circuit by comparing a value of the current measured by the first measuring step with a predetermined value.

DESCRIPTION OF THE PREFERRED EMBODIMENTS

Hereinafter, a short detection circuit and a short detection method in the preferred embodiments will be described in detail with reference to the attached drawings.

[First Embodiment]

Figure 3:
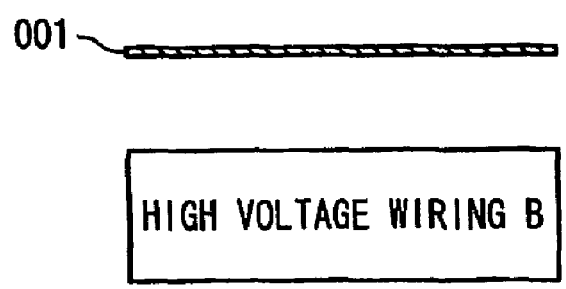
FIG. 3 shows a circuit on which a detection-dedicated interconnection between the high-voltage interconnection A and the high-voltage interconnection B is formed.

FIG. 3 shows the short detection circuit of the first embodiment. In the short detection circuit, a high-voltage interconnection A and a high-voltage interconnection B are provided on a substrate. In FIG. 3, the interconnection A and the interconnection B are parallel. The potential of the interconnection A and the potential of the interconnection B may be different. A high-voltage interconnection means the interconnection to which the voltage of tens of volts or more is applied in usual operations.

A detection-dedicated interconnection 001 is provided between the high-voltage interconnections A and B. The interconnection 001 is not connected with the interconnection A and B. The interconnection 001 has a terminal unit to which external devices exemplified by an ammeter and a power supply can be connected. In FIG. 3, the interconnection 001, interconnections A and B are parallel to each other. The detection-dedicated interconnection 001 is manufactured in the process that is in parallel to the process of the high-voltage interconnection A and B. The detection-dedicated interconnection 001 is arranged so as to provide the potential independently from the high-voltage interconnection A and B.

Figure 4:
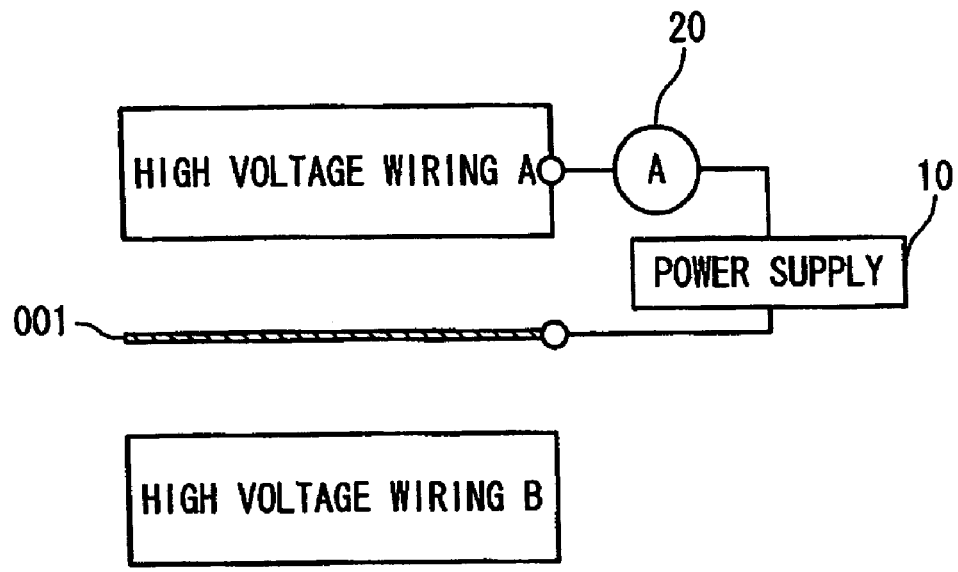
FIG. 4 shows the test 1-1.

FIG. 4 shows an equivalent circuit diagram in the test 1-1, which is one of the testing methods using the short detection circuit shown in FIG. 3. Here, a power supply and an ammeter are connected in series between the high-voltage interconnection A and the detection dedicated interconnection 001. The power supply applies a controlled predetermined voltage between the positive terminal and the negative terminal. The ammeter detects the electric current generated from the power supply.

Figure 5:
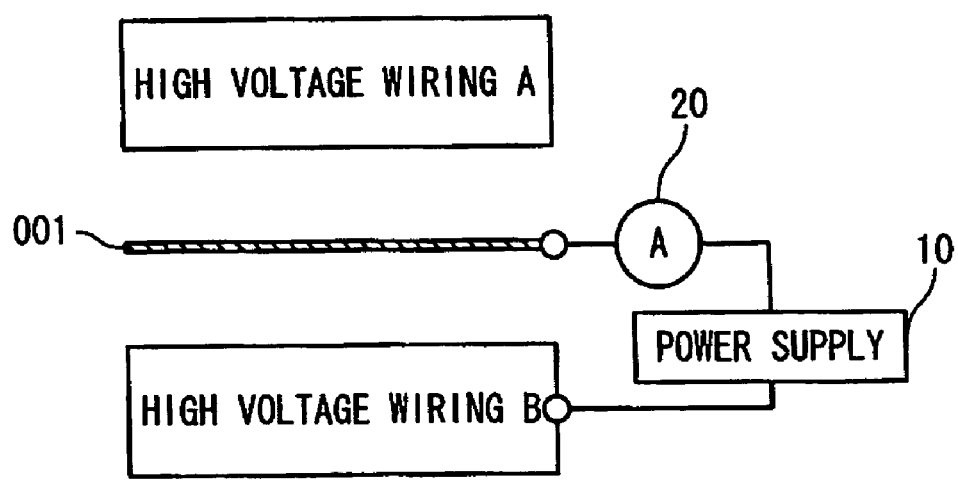
FIG. 5 shows the test 1-2.

FIG. 5 shows an equivalent circuit diagram in the test 1-2, which is an another testing method using the short detection circuit shown in FIG. 3. Here, a power supply and an ammeter are connected in series between the high-voltage interconnection B and the detection dedicated interconnection 001. The ammeter detects the electric current generated by the power supply.

In the tests 1-1 and 1-2, each voltage applied by the power supply is allowable to be lower than the one in the usual operation under the condition that the short-defect with time passing can be detected.

Figure 1:
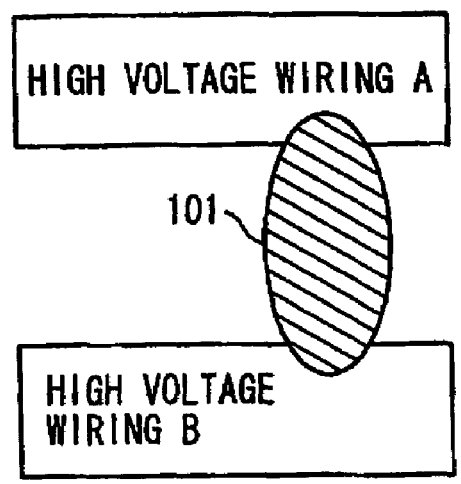
FIG. 1 shows a conductive foreign matter judged as short-defect by a usual test.
Figure 2:
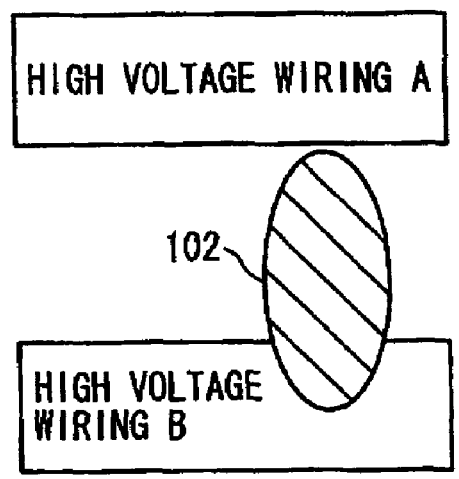
FIG. 2 shows a conductive foreign matter which is not judged as short-defect by a usual test but having possibility to become short-defect with time passing.
Figure 6:
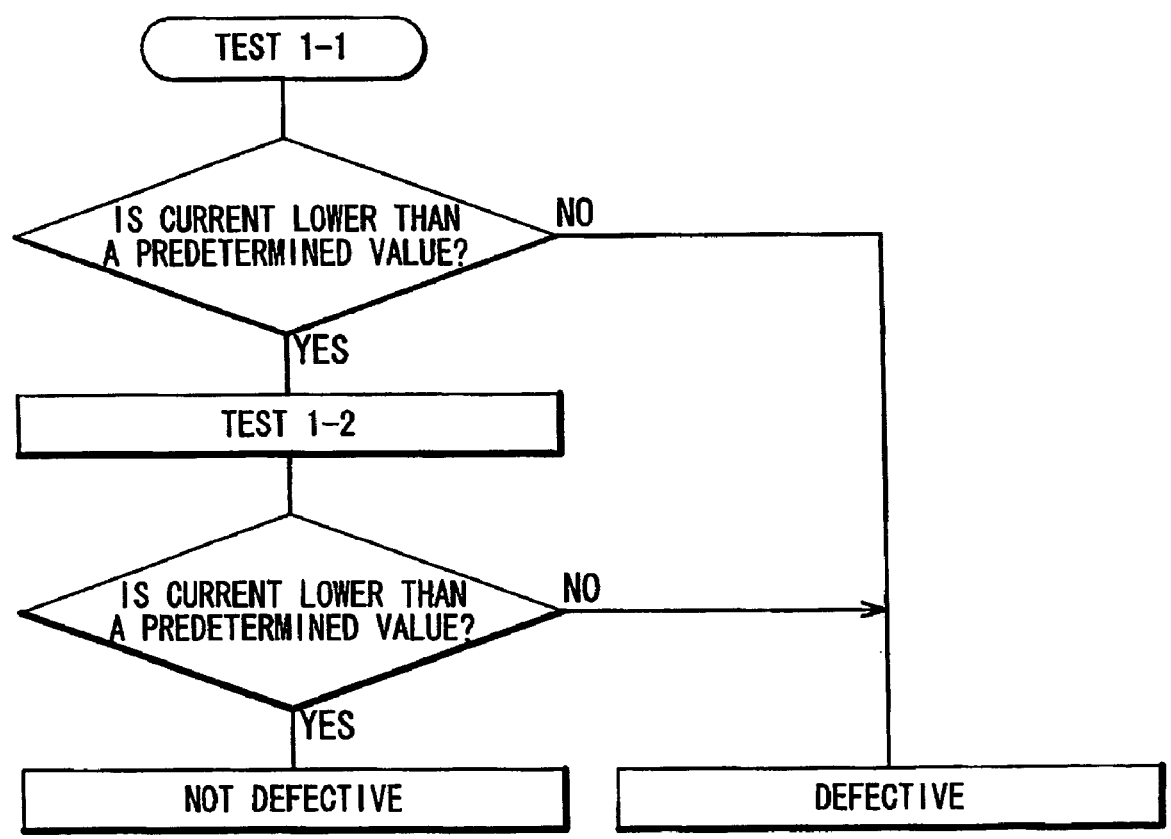
FIG. 6 is a flow chart of the testing according to the first embodiment.

FIG. 6 is a flowchart of the test of the short-defect with time passing in the first embodiment. The flowchart shows the test of the short-defect with time passing, in which a conductive foreign matter 102 exists as shown in FIG. 2 is referred as an example.

Figure 7:
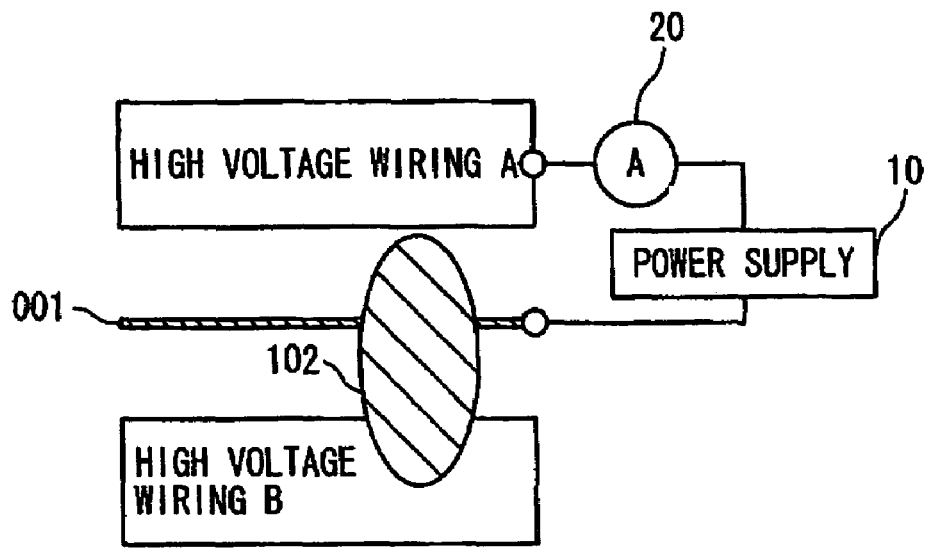
FIG. 7 is the application example of the test 1-1.

First, the test 1-1 is executed on a suspected substance as shown in FIG. 7. If the current value detected by the ammeter is higher than a predetermined value, the suspected substance is judged as a defective. In FIG. 7, the suspected substance is not judged as the defective in the test 1-1.

Figure 8:
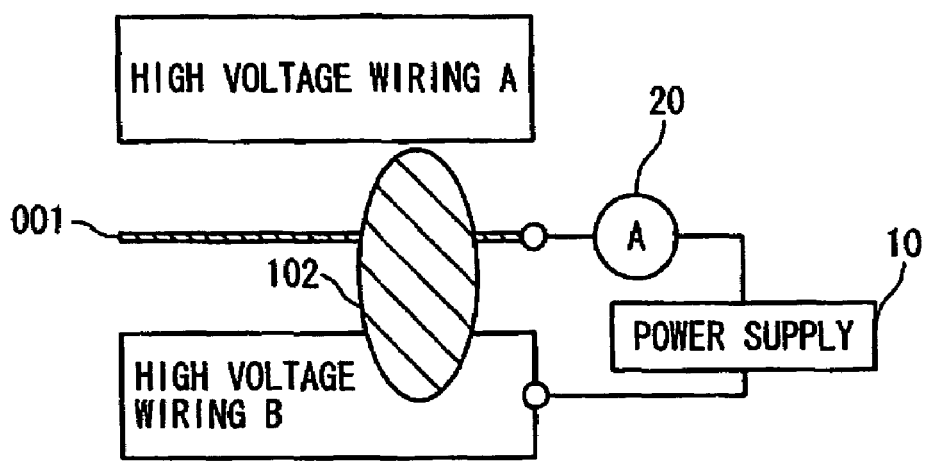
FIG. 8 is the application example of the test 1-2.

If the current value detected in the test 1-1 is lower than a predetermined value, the test 1-2 is executed as shown in FIG. 8. Then, in the case that the current value detected in the test 1-2 detected at that time is higher than a predetermined value, the suspected substance is judged as being defective. In FIG. 8, the conductive foreign matter 102, which exists in the suspected substance, contacts with each of the high-voltage interconnection B and the detection-dedicated interconnection 001. Therefore, the suspected substance is judged as being defective because it has a possibility to cause the short-defect with time passing. If the current values detected in both tests 1-1 and 1-2 are lower than predetermined values, the circuit is judged as being non-defective having few possibility to cause the short-defect with time passing.

[Second Embodiment]

Figure 9:
FIG. 9 shows a circuit on which two detection-dedicated interconnections between the high-voltage interconnection A and the high-voltage interconnection B are formed.
Figure 9:

FIG. 9 shows a circuit in a second embodiment. A high-voltage interconnection A and a high-voltage interconnection B that is arranged in parallel to the high-voltage interconnection A are shown in FIG. 9. The potential of the interconnection A and the potential of the interconnection B may be different. A detection-dedicated interconnection 002 is provided between the high-voltage interconnection A and the high-voltage interconnection B. A detection-dedicated line 003 is provided between the detection-dedicated interconnection 002 and the high-voltage interconnection B. The interconnection 002 is not connected to the interconnections A and B. The interconnection 003 is not connected to the interconnections A, B and 002.

The interconnection 002 has a terminal unit to which external devices exemplified by an ammeter and a power supply can be connected. The interconnection 003 has the same kind of terminal.

The distance between the high-voltage interconnection A and the detection-dedicated interconnection 002 is equal to the distance between the detection-dedicated line 003 and the high-voltage interconnection B. The detection dedicated interconnection 002 and the detection-dedicated line 003 are manufactured in the parallel processes to the processes of the high-voltage interconnections A and B. The detection dedicated interconnection 002 and the detection-dedicated line 003 are arranged so as to provide the potential independently from the high-voltage interconnections A and B. The potential of the detection dedicated interconnection 002 and the detection-dedicated line 003 can be also provided independently.

Figure 10:
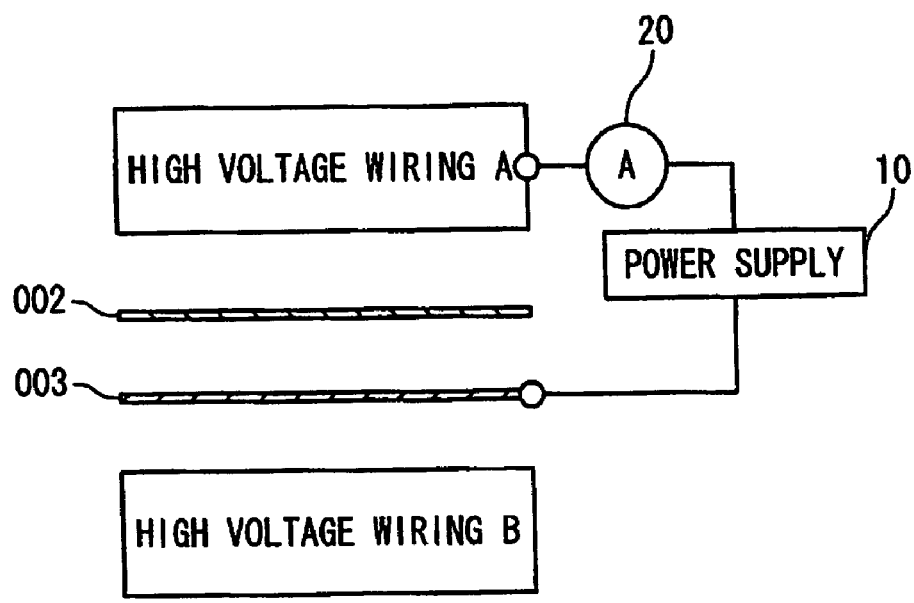
FIG. 10 shows the test 2-1.

FIG. 10 shows an equivalent circuit diagram in the test 2-1, which is one of the testing methods using the short detection circuit shown in FIG. 9. Here, a power supply and an ammeter are connected in series between the high-voltage interconnection A and the detection dedicated line 003.

Figure 11:
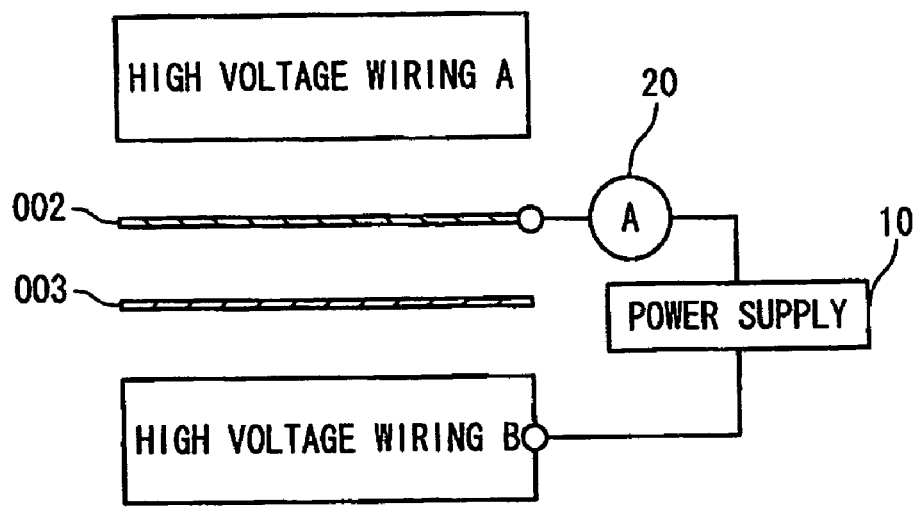
FIG. 11 shows the test 2-2.

FIG. 11 shows an equivalent circuit diagram in the test 2-2, which is one of the testing methods using the short detection circuit shown in FIG. 9. Here, a power supply and an ammeter are connected in series between the detection-dedicated interconnection 002 and the high-voltage interconnection B.

Figure 12:
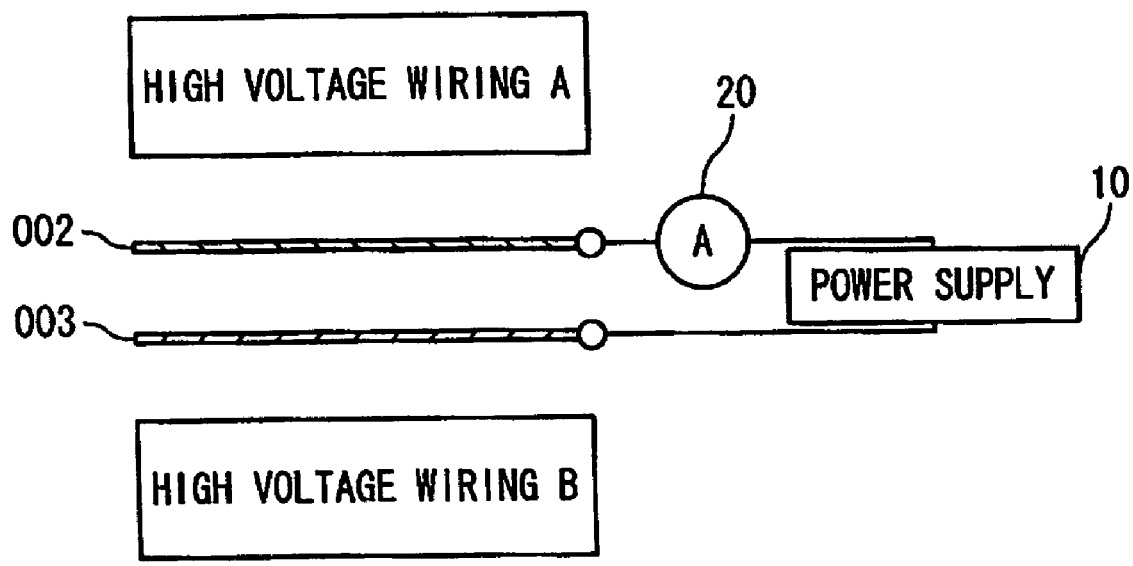
FIG. 12 shows the test 2-3.

FIG. 12 shows an equivalent circuit diagram in the test 2-3, which is an another testing method using the short detection circuit shown in FIG. 9. Here, a power supply and an ammeter are connected in series between the detection-dedicated interconnection 002 and the detection dedicated line 003.

In the tests 2-1, 2-2 and 2-3, each voltage applied by the power supply is allowable to be lower than the one in the usual operation under the condition that the short-defect with time passing can be detected. The ammeter which can detect that the detected value is higher than a setting value which is set in larger value than a normal leak current at the voltage of this process in these tests.

Figure 13:
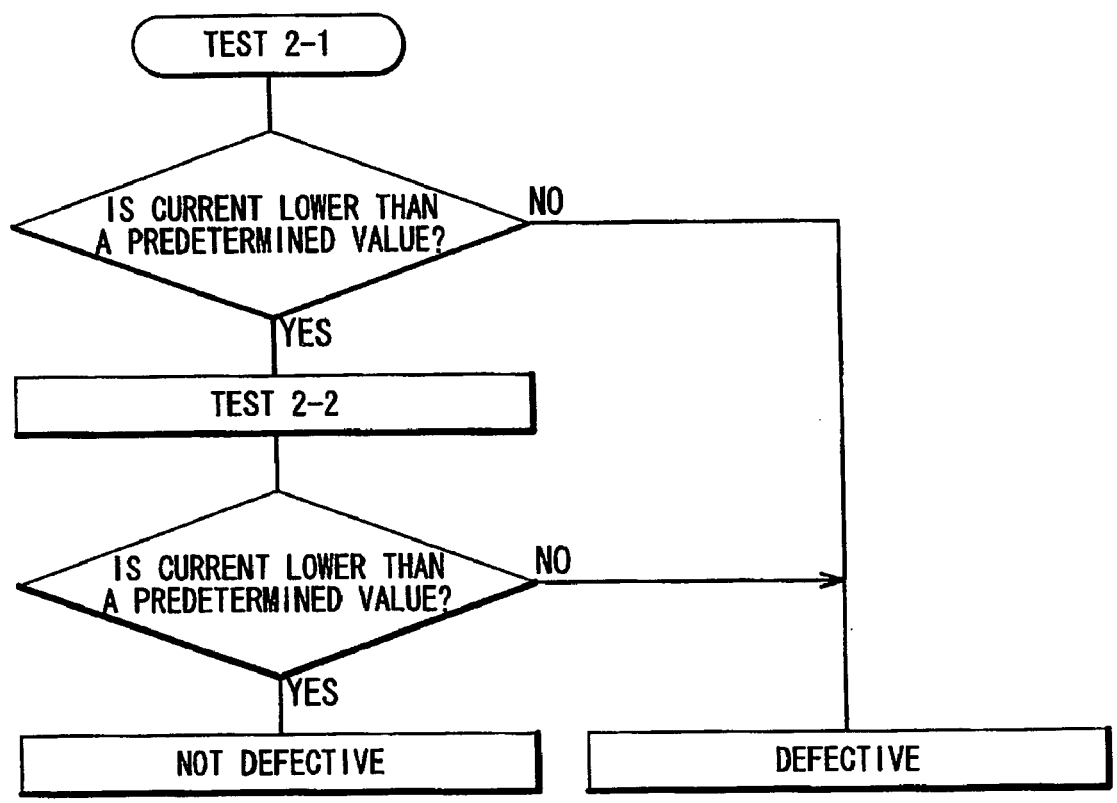
FIG. 13 is the flow chart of the testing according to the second embodiment.

FIG. 13 is the flowchart of the test of the short-defect with time passing in the second embodiment. First, the test 2-1 is executed on a suspected substance. If the current value detected in this test is higher than a predetermined value, the suspected substance is judged as being defective having the high potential of the short-defect with time passing. If the current value is equal to or lower than the predetermined value, the test 2-2 is executed. Then, in the case that the current value detected in the test 2-2 is higher than a predetermined value, the suspected substance is judged as being defective. If the current values detected in both tests 2-1 and 2-2 are lower than predetermined values, the circuit is judged as being non-defective having few possibility to cause the short-defect with time passing.

Figure 14:
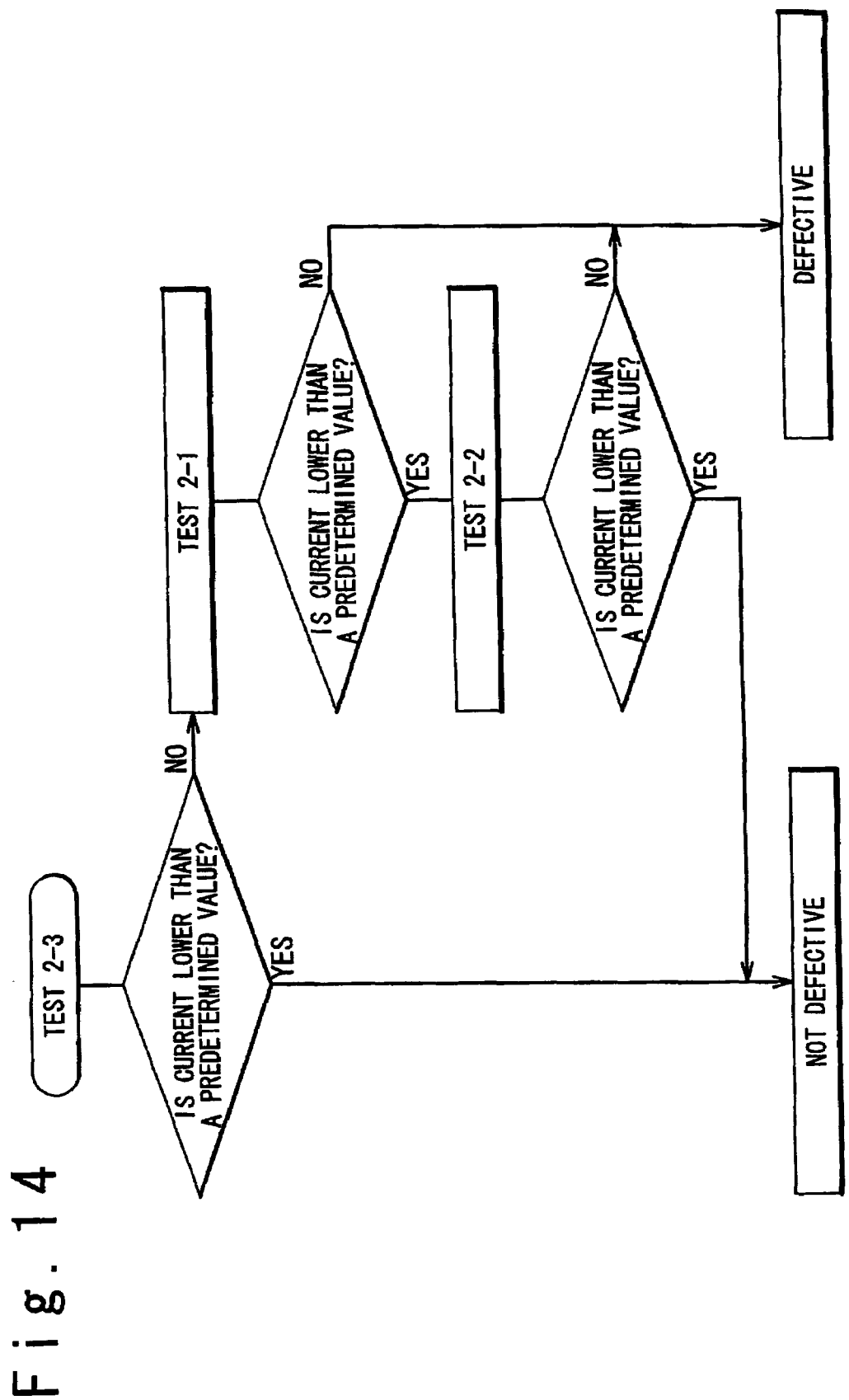
FIG. 14 is the flow chart of the testing according to the second embodiment.

FIG. 14 is a second flowchart of the test of the short-defect with time passing in the second embodiment. First, the test 2-3 is executed on a suspected substance. If the current value detected in this test is equal to or lower than a predetermined value, the suspected substance is judged as being non-defective. If the current value detected in this test is larger than the predetermined value, the test 2-1 is executed. If the current value detected in the test 2-1 is larger than a predetermined value, the suspected substance is judged as being defective. If the current value detected in the test 2-1 is equal to or lower than the predetermined value, the test 2-2 is executed. Further, if the current value detected in the test 2-2 is larger than a predetermined value, the suspected substance is judged as being defective. If the current value detected in the test 2-2 is equal to or lower than the predetermined value, the suspected substance is judged as being non-defective.

When it is known that the incidence rate of the conductive foreign matter is low, the judgment whether the suspected substance is the non-defective or the defective can be achieved by only the step of the test 2-3. Therefore, the testing time of the testing flow shown in FIG. 14 is shorter generally. Contrary, if the incidence rate of the defect is high in the test 2-3 (for example, 50% or more), the testing time of the testing flow shown in FIG. 13 in which the judgment is carried in two steps is shorter.

Figure 15:
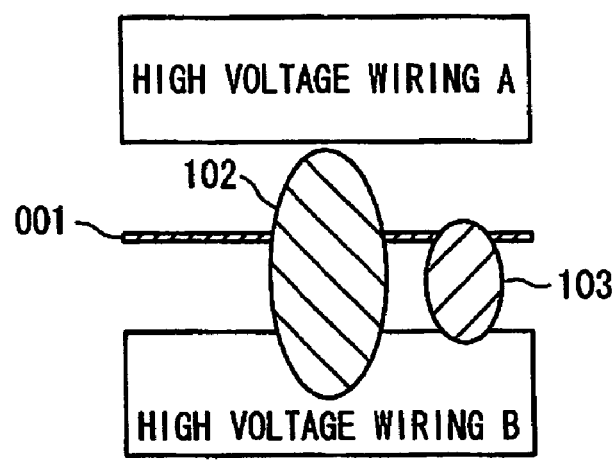
FIG. 15 shows a conductive foreign matter having high possibility of becoming the short-defect with time passing and being judged as a defect by the test 1-2.

The short detection circuit and the short detection method in the second embodiment have following characteristics in comparison with the first embodiment. Referring to FIG. 15, it is assumed that a large conductive foreign matter 102 and a smaller conductive foreign matter 103 are touched with the high-voltage interconnection B. The conductive foreign matter 103 is small and has few possibilities to cause the short-defect with time passing. Therefore, in this case, it is desirable that the suspected substance may be judged as the non-defective when only the conductive foreign matter 103 exists. However, in the first embodiment, when any one of the electrical conductive foreign matters 102 and 103 exists, both of the suspected substances are judged as defectives. This causes that the rate of the non-defective products falls more than necessary, and the manufacturing cost of the products increases.

Figure 16:
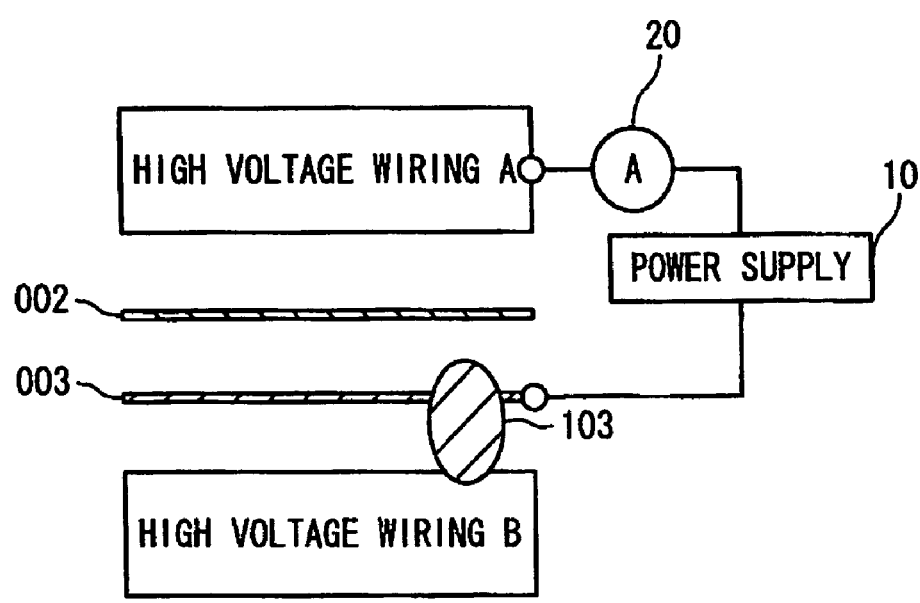
FIG. 16 is the application example of the test 2-1.
Figure 17:
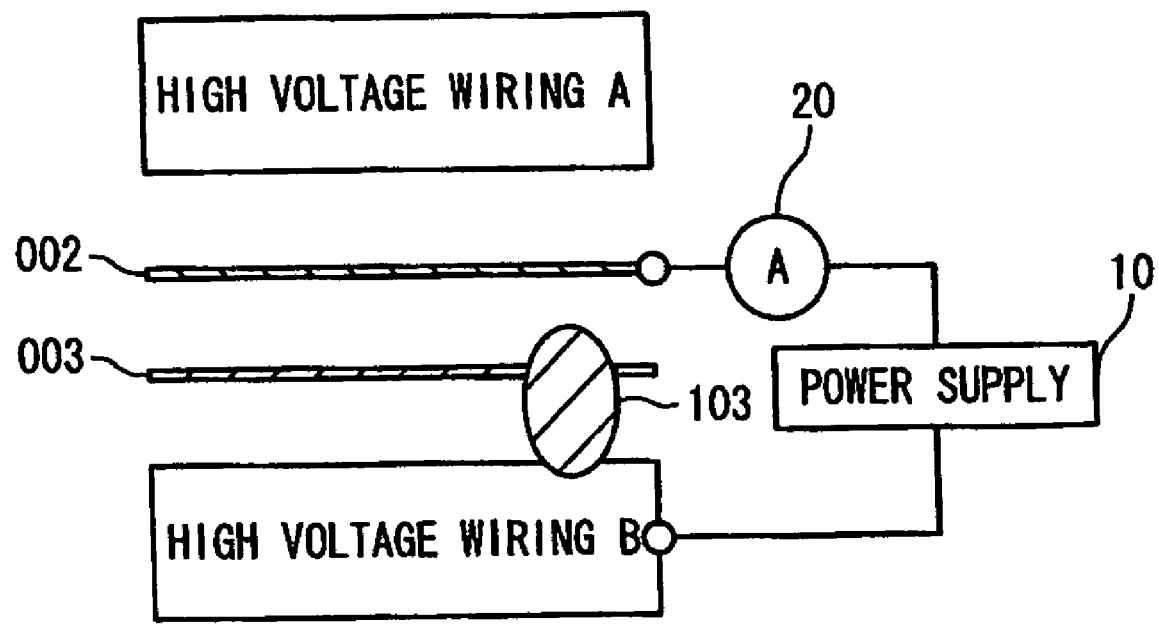
FIG. 17 is the application example of the test 2-2.
Figure 18:
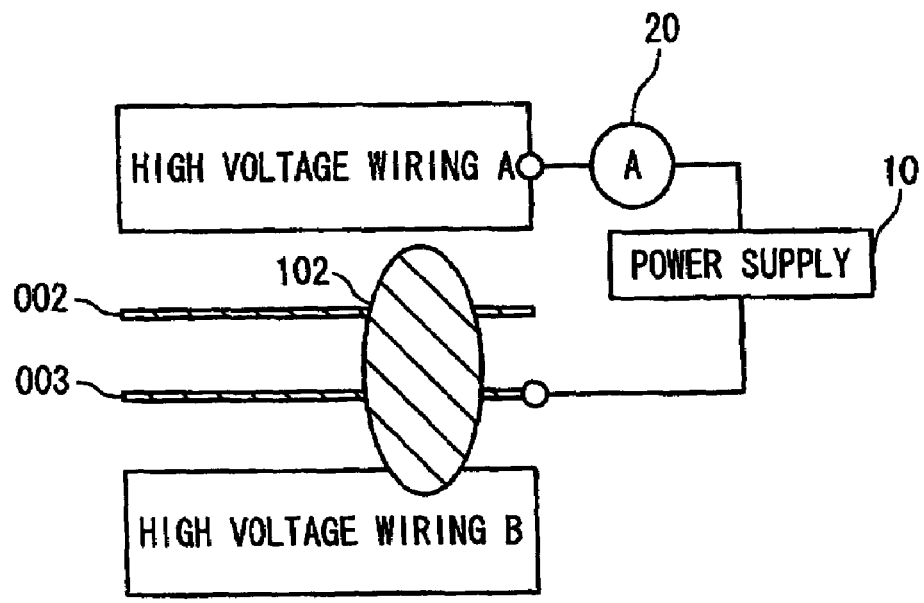
FIG. 18 is the application example of the test 2-1.
Figure 19:
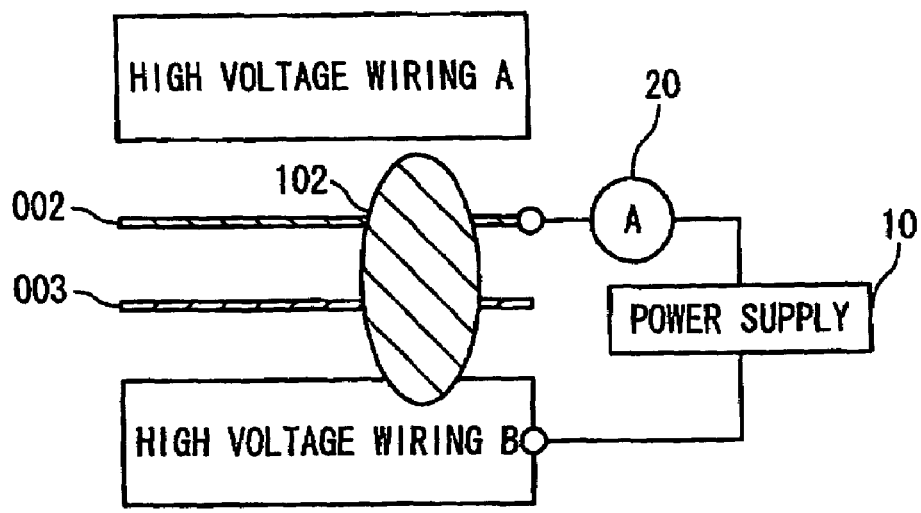
FIG. 19 is the application example of the test 2-2.
Figure 20:
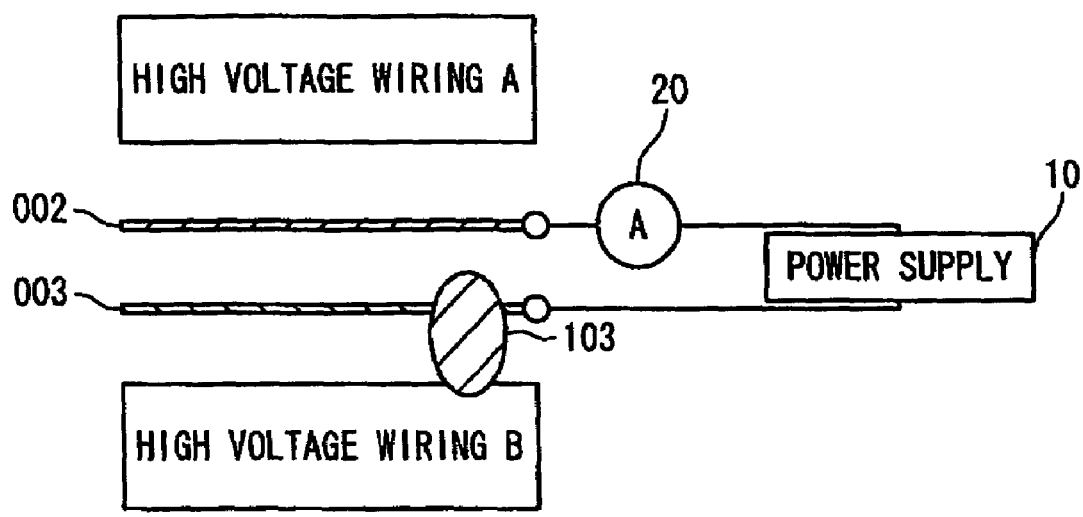
FIG. 20 is the application example of the test 2-3.
Figure 21:
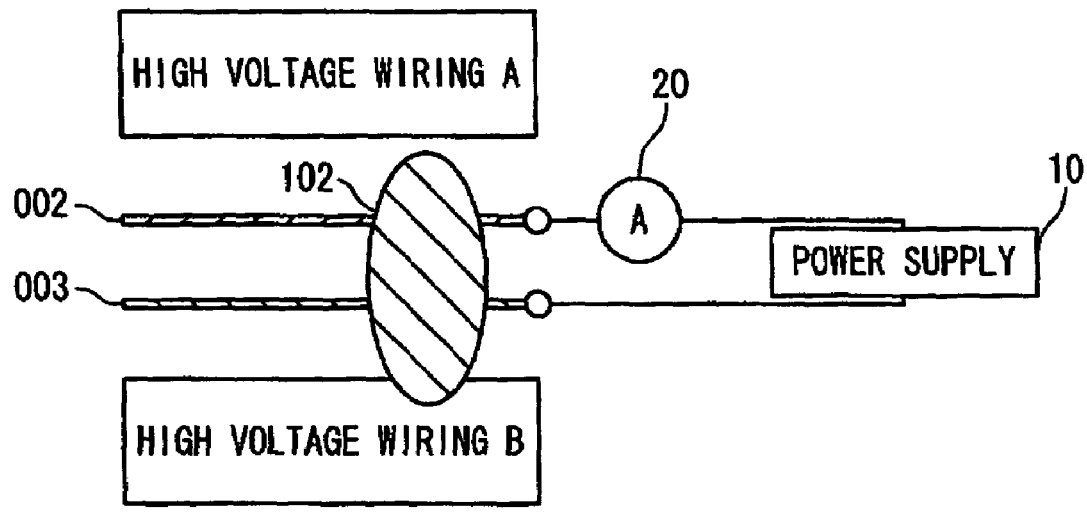
FIG. 21 is the application example of the test 2-3.

In the second embodiment, as for the conductive foreign matter 103, the detected current value is lower than a predetermined value, and is judged as being non-defective in the test 2-1 shown in FIG. 16, the test 2-2 shown in FIG. 17 and in the test 2-3 shown in FIG. 20. On the other hand, as for the conductive foreign matter 102, it is judged as being defective in the test 2-2 shown in FIG. 19 or the test 2-3 shown in FIG. 21. When the conductive foreign matter 102 contacts with the high-voltage interconnection A and occupies near the high-voltage interconnection B, it is judged as being defective in the test 2-1 or the test 2-3. Therefore, in the second embodiment, only the suspected substance which includes the conductive foreign matter with the large possibility to cause the short-defect with time passing can be judged as being defective.

Figure 22:
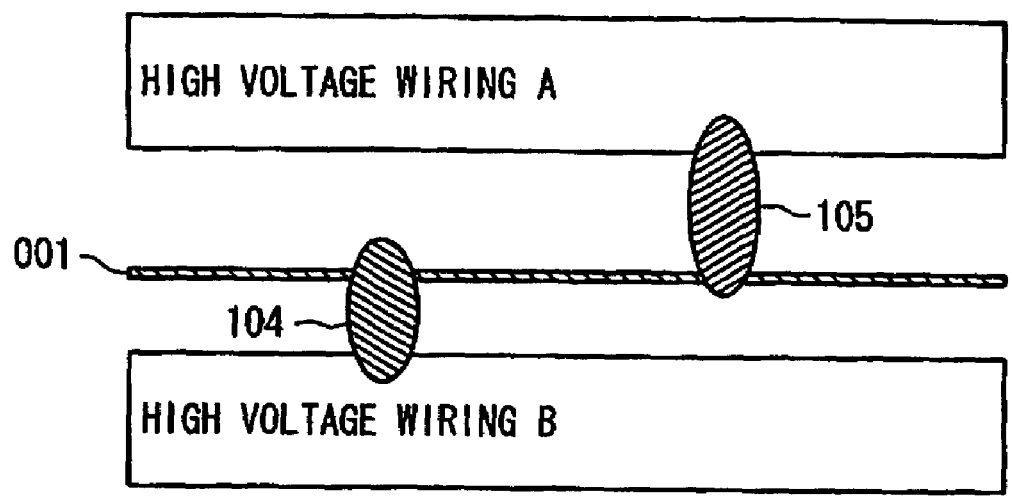
FIG. 22 shows the case of short-defect by a detection-dedicated interconnection and two conductive matters.

Referring to FIG. 22, the detection-dedicated interconnection 001 is provided between the high-voltage interconnection A and the high-voltage interconnection B as well as the first embodiment. The high-voltage interconnection A and the detection-dedicated interconnection 001 are conducted through the conductive foreign matter 105. Further, the detection dedicated interconnection 001 and high-voltage interconnection B are conducted through the conductive foreign matter 104. That is, providing the detection-dedicated interconnection 001 causes the high-voltage interconnection A and the high-voltage interconnection B to be short-circuited by the comparatively small conductive foreign matters 104 and 105 though they should not be short-circuited originally.

Figure 23:
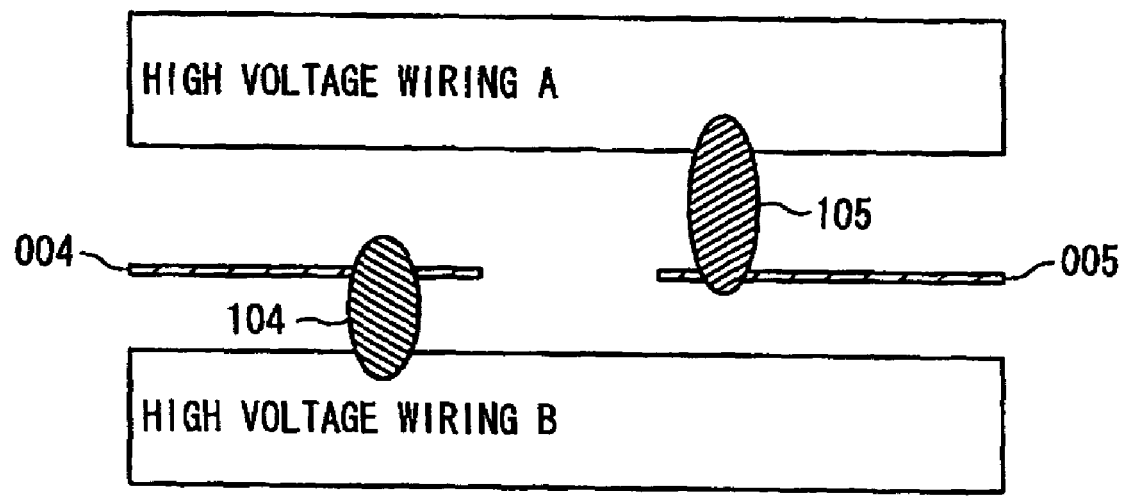
FIG. 23 shows the appearance of dividing the detecting interconnection to avoid the short-defect.

In order to decrease such occurrence of the short circuit, it is effective to divide the detection dedicated interconnection 001 into the detection dedicated interconnection 004 and the detection dedicated interconnection 005 as shown in FIG. 23. In FIG. 23, there is a clearance between the detection dedicated interconnection 004 and the detection dedicated interconnection 005 from a viewpoint of a normal direction of the interconnection A. The detection dedicated interconnection 005 is positioned on the extension of the interconnection 004. Each of the detection dedicated interconnections 004 and 005 has a terminal unit for connecting the external devices.

Figure 24:
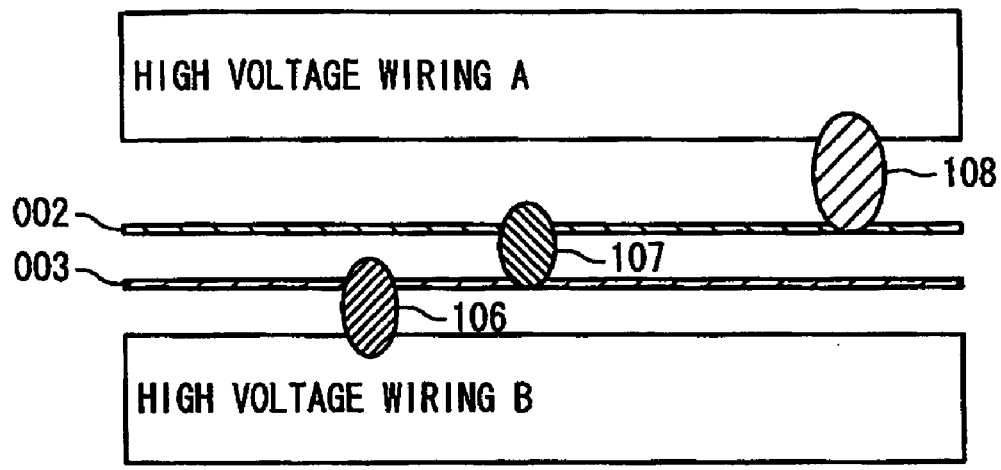
FIG. 24 shows the short-defect by a detection-dedicated interconnection and three conductive foreign matters.
Figure 25:
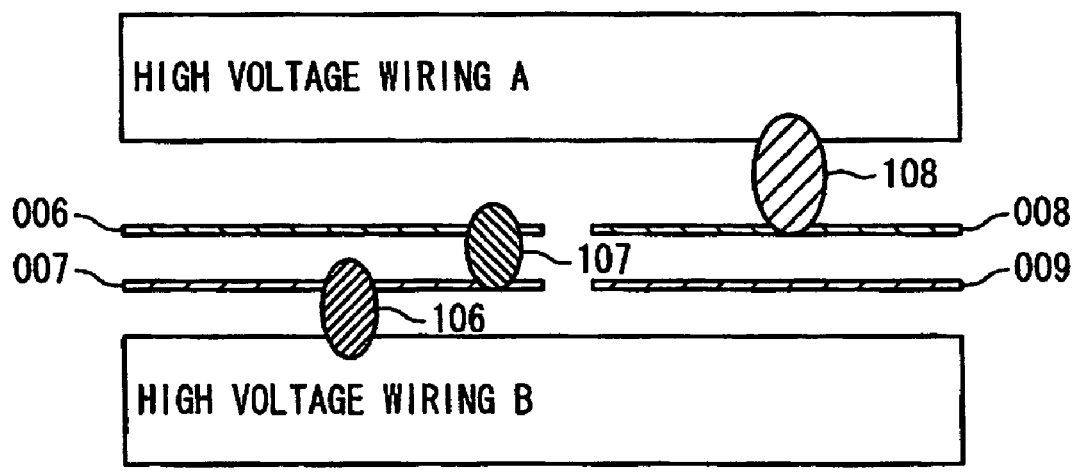
FIG. 25 shows the appearance of dividing the detecting interconnection to avoid the short-defect.

Referring to FIG. 24, two detection-dedicated interconnections 002 and 003 are provided between the high-voltage interconnection A and the high-voltage interconnection B as well as the second embodiment. In this case, the comparatively small conductive foreign matters 106, 107 and 108 possibly cause the high-voltage interconnections A and B to be short-circuited. In order to decrease such short-circuit, it is effective to divide the detection dedicated interconnection 002 into detection dedicated interconnections 006 and 008, and the detection dedicated interconnection 003 into the detection dedicated interconnections 007 and 009 as shown in FIG. 25.

According to the short detection circuit and the short detection method of the present invention, though such detection of the short-defect with time passing using the overvoltage is carried out in a low-voltage circuit, it becomes possible to detect the short-defect with time passing of the high-voltage circuit at the applied voltage equal to the usual detection.

What is claimed is:

1. A short detection circuit comprising:
    a first interconnection;
    a second interconnection;
    a first detecting interconnection positioned between said first interconnection and said second interconnection and unconnected to said first interconnection and said second interconnection, which includes a terminal to connect said first detecting interconnection to a power supply, an ammeter and said first or said second interconnection in series; and
    a second detecting interconnection positioned on an extension of said first detecting interconnection, and unconnected to said first detecting interconnection, which includes a terminal to connect said second detecting interconnection to a power supply, an ammeter and said first or said second interconnection in series, and having a terminal for connecting said first detecting interconnection to a power supply and an ammeter connected in series,
    wherein said first interconnection has a terminal for connecting a power supply and an ammeter connected in series, and
    wherein said second interconnection has a terminal for connecting a power supply and an ammeter connected in series.

2. The short detection circuit according to claim 1,
    wherein a distance between said first interconnection and said first detecting interconnection is equal to a distance between said first detecting interconnection and said second interconnection.

3. The short detection circuit according to claim 1,
    wherein said first interconnection and said second interconnection are high-voltage interconnections which are connected to elements having high possibility to be broken down or deteriorated when a voltage higher than usual use is applied.

4. The short detection circuit according to claim 1, further comprising:
    a third detecting interconnection positioned between said second interconnection and said first detecting interconnection, and unconnected to said second interconnection and said first detecting interconnection, which includes a terminal to connect said third detecting interconnection to a power supply, an ammeter and said first or said second interconnection in series.

5. The short detection circuit according to claim 4, further comprising:
    a fourth detecting interconnection positioned between said second interconnection and said second detecting interconnection, and unconnected to said second interconnection and said second detecting interconnection, which includes a terminal to connect said fourth detecting interconnection to a power supply, an ammeter and said first or said second interconnection in series.

6. A shod detection circuit comprising:
    a first interconnection;
    a second interconnection;
    a first detecting interconnection positioned between said first interconnection and said second interconnection, and unconnected to said first interconnection and said second interconnection, which includes a terminal to connect said first detecting interconnection to a power supply, an ammeter and said first or said second interconnection in series; and
    a second detecting interconnection positioned between said first interconnection and said second interconnection, and unconnected to said first interconnection, said second interconnection and said first detecting interconnection,
    which includes a terminal to connect said second detecting interconnection to a power supply, an ammeter and said first or said second interconnection connected in series.

7. A method to detect a short-circuit comprising:
    providing a first detecting interconnection between a first interconnection and a second interconnection;
    providing a second detecting interconnection between said first interconnection and said second interconnection;
    applying a first predetermined voltage between said first interconnection and said first detecting interconnection to measure a first current and;
    applying a second predetermined voltage between said second interconnection and said first detecting interconnection and measuring a second current; and
    first judging a possibility of a short-circuit between said first and said second interconnections by comparing a first predetermined current with said first current and comparing a second predetermined current with said second current.

8. The method to detect a short-circuit according to claim 7, further comprising:
    providing a third detecting interconnection between said first detecting interconnection and said second interconnection;
    applying a third predetermined voltage between said first detecting interconnection and said second detecting interconnection to measure a third current;
    applying a fourth predetermined voltage between said third detecting interconnection and said first interconnection to measure a fourth current; and
    second judging a possibility of a short-circuit between said first and said second interconnection by comparing a third predetermined current with said third current and comparing a fourth predetermined current with said fourth current.

9. The method to detect a short-circuit according to claim 7, wherein when said first current is more than said first predetermined current or said second current is more than said second predetermined current, said first interconnection and said second interconnection are short-circuited.

10. The method to detect a short-circuit according to claim 8, wherein when said third current is more than said third predetermined current or said fourth current is more than said fourth predetermined current said first interconnection and said second interconnection are short-circuited.

11. A short detection circuit comprising:

a first interconnection;

a second interconnection;

a first detecting interconnection positioned between said first interconnection and said second interconnection, which includes a terminal to connect said first detecting interconnection to a power supply, an ammeter and said first or said second interconnection in series; and a second detecting interconnection positioned between said second interconnection and said first detecting interconnection, and unconnected to said second interconnection and said first detecting interconnection, which includes a terminal to connect said second detecting interconnection to a power supply, an ammeter and said first or said second interconnection in series, wherein said first and second detecting interconnections detect a short-defect with time passing between said first and said second interconnections.

12. The short detection circuit according to claim 11, further comprising:

a third detecting interconnection positioned on an extension of said second detecting interconnection, and unconnected to said second detecting interconnection, which includes a terminal to connect said third detecting interconnection to a power supply, an ammeter and said first or said second interconnection in series.

13. The short detection circuit according to claim 12, wherein a distance between said first interconnection and said first detecting interconnection is equal to a distance between said second interconnection and said second detecting interconnection.

14. The short detection circuit according to claim 13, wherein said first interconnection and said second interconnection are high-voltage interconnection which are connected to elements having high possibility of being broken down or deteriorated when a voltage higher than usual use is applied.

* * * * *